United States Patent [19]

Duerrschnabel et al.

[11] Patent Number: 4,734,255

[45] Date of Patent: Mar. 29, 1988

[54] USE OF A COPPER-TITANIUM-COBALT ALLOY AS THE MATERIAL FOR ELECTRONIC COMPONENTS

[75] Inventors: Wolfgang Duerrschnabel, Bellenberg; Franz J. Puckert, Illerrieden; Heinrich Stueer, Voehringen, all of Fed. Rep. of Germany

[73] Assignee: Wieland-Werke AG, Ulm, Fed. Rep. of Germany

[21] Appl. No.: 843,944

[22] Filed: Mar. 25, 1986

[30] Foreign Application Priority Data

Apr. 2, 1985 [DE] Fed. Rep. of Germany ....... 3511999

[51] Int. Cl.⁴ .............................................. C22C 9/06
[52] U.S. Cl. .................................. 420/492; 420/496; 357/70
[58] Field of Search ............... 420/492, 496; 148/432, 148/411, 414

[56] References Cited

U.S. PATENT DOCUMENTS 3,201,234 8/1965 Scherbner et al. .................. 420/476

FOREIGN PATENT DOCUMENTS 114338 8/1984 European Pat. Off. ............ 420/492
593783 3/1934 Fed. Rep. of Germany .

OTHER PUBLICATIONS

*Chemical Abstracts*, V 99:26597u, Nowinski et al., 1983.
Leadframe Materials from Tamagawa, Tamagawa Metal & Machinery Co., Ltd., title page and pp. i–iii and 3, 4, and 10, 1983.
Kupfer und Kupferlegierungen in der Technik, Dr.--Ing. Kurt Dies, Springer-Verlag, 1967, pp. 622–637.

*Primary Examiner*—L. Dewayne Rutledge
*Assistant Examiner*—George Wyszomierski
*Attorney, Agent, or Firm*—Flynn, Thiel, Boutell & Tanis

[57] ABSTRACT

The invention relates to the use of a copper-titanium-cobalt-alloy which consists of 0.05–0.6% titanium; 0.05–0.6% cobalt; remainder copper, whereby the cobalt is partially replaced by iron. Due to its excellent characteristics with respect to electrical and thermal conductivity, mechanical strength, softening resistance and homogeneity, the alloy is used as the material for electronic components, in particular lead frames for transistors, integrated circuits or the like, and parts for electronic components for automobiles.

9 Claims, 3 Drawing Figures

USE OF A COPPER-TITANIUM-COBALT ALLOY AS THE MATERIAL FOR ELECTRONIC COMPONENTS

FIELD OF THE INVENTION

The invention relates to the use of copper alloys as the material for electronic components, in particular so called lead frames for transistors, integrated circuits or the like, and parts for electronic components for automobiles.

BACKGROUND OF THE INVENTION

Materials for electronic components, in particular lead frames of the mentioned type, must have a combination of particular characteristics:
(a) the electric and thermal conductivity should be as high as possible (higher than 50% IACS);
(b) a high mechanical strength is required;
(c) moreover, a high resistance to softening is required. A measure for the softening resistance is the so called semihardness temperature $T_H$, which is obtained from a softening curve (Vickers hardness HV as a function of the annealing temperature T). The semihardness temperature $T_H$ is thereby associated with the value $$HV_{min} + \frac{HV_{max} - HV_{min}}{2};$$

(d) increasingly homogeneous materials are required, that is, materials in which the structure does not contain any coarse grams, separations or inclusions, so that a satisfactory connection between the so called bond wires and the lead frame is assured.

Iron-nickel-alloys or copper-iron-alloys, for example, CuFe2P (Alloy No. C 19400) or CuFeSnP (Alloy No. C 19520), among others have been used thus far to a great degree for the mentioned use. However, the electrical conductivity and, because of the relatively high amounts of alloy components, the homogeneity of the materials, leaves much to be desired.

For the connecting parts in electronic components for automobiles, a material having an electrical conductivity which is as high as possible with a simultaneously high strength characteristic and thus sufficient mechanical stability is demanded because of the high current load.

The basic purpose of the invention is to overcome the aforementioned disadvantages and to provide a material for electronic components, in particular lead frames for transistors, integrated circuits or the like, and parts for electronic components for automobiles having particularly favorable characteristics.

DETAILED DESCRIPTION

Figure 1:
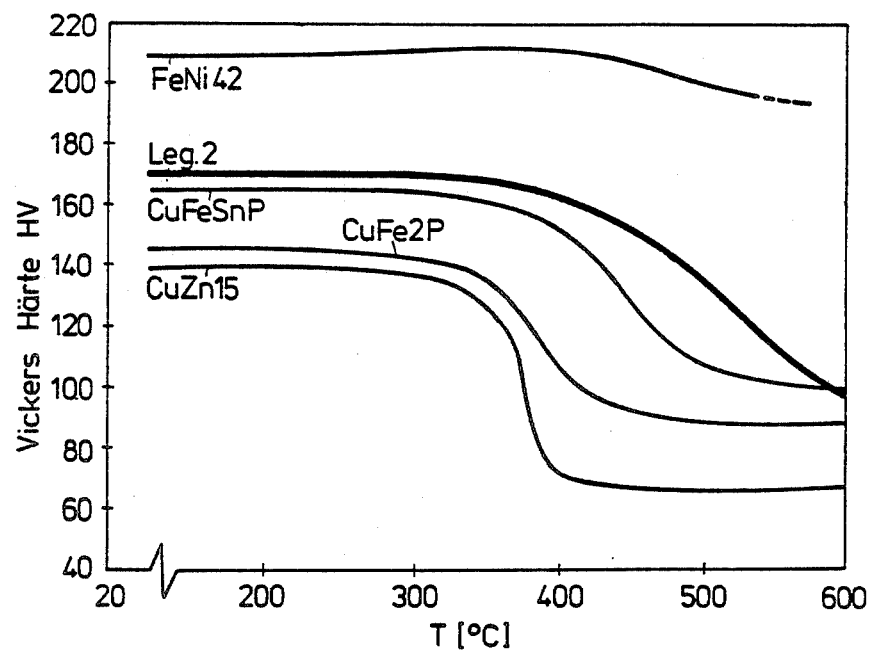
FIG. 1 is a graph showing the relationship between Vickers hardness and temperature for an alloy according to the invention and several prior art alloys.

The purpose is inventively attained by the use of a copper-titanium-cobalt-alloy, which consists of 0.05 to 0.6% titanium; 0.05 to 0.6% cobalt; remainder copper and the usual impurities (the percentages are percentages by weight). Advantages of this composition will be discussed in greater detail in connection with the exemplary embodiment.

A ternary copper alloy is known from German Pat. No. 593 783 which contains at a maximum 4% titanium and an addition of one of the elements nickel, chromium, manganese, iron, cobalt or molybdenum in an amount up to 10%. However, the inventive purpose of use is not suggested by these alloys, especially since they are used preferably as construction materials, for example, in the form of press rods, pipes and the like, and they do meet the requirement for high strength, however, they do not meet the simultaneous requirement for electrical conductivity.

According to a preferred embodiment of the present invention, an alloy is used consisting of 0.2 to 0.5% titanium; 0.2 to 0.5% cobalt; remainder copper.

Particular good value combinations occur if the ratio of titanium content to cobalt content Ti/Co is in the range of 1.0 to 1.5.

It is particularly advisable if an inventive alloy is used in which the cobalt is replaced partially with iron, that the above-mentioned ratio Ti/(Co+Fe) in the range of 1.0 to 1.5 is maintained. For example, Up to 50% of the Co in the alloy can be replaced by Fe. For example, the alloy consists of 0.05 to 0.6% titanium; 0.05 to 0.3% Co; up to 0.3% Fe; and the remainder is copper.

Electronic components, in particular so called lead frames for transistors, integrated circuits or the like, and parts for electronic components for automobiles, according to the invention, consist of a copper-titanium-cobalt-alloy, which contains 0.05 to 0.6% titanium; 0.05 to 0.6% cobalt; in particular 0.2 to 0.5% titanium; 0.2 to 0.5% cobalt; remainder copper, wherein preferably the weight ratio of the titanium content to the cobalt content Ti/Co is in the range of 1 to 1.5. Further developments of the invention result if the cobalt is partly replaced by iron and the ratio of titanium to cobalt plus iron is in the range of 1.0 to 1.5.

The invention will be discussed in greater detail with reference to the following exemplary embodiment:

Table 1 shows the composition of two inventive alloys:

TABLE 1

| Composition of the samples (information in percentage by weight) | | | | |
|---|---|---|---|---|
| Sample Identification | Ti | Co | Fe | Cu |
| 1 | 0.10 | 0.10 | n.m | remainder |
| 2 | 0.31 | 0.14 | 0.17 | remainder | n.m. = not measurable

The alloys were manufactured in the following manner:

Cathode copper was melted at approximately 1200° C. with a charcoal cover in a Tammann oven to obtain oxygen-free copper. The alloy elements titanium and cobalt or titanium, cobalt and iron were subsequently added in form of suitable master alloys to the melt. The master alloys contained 28.0% by weight titanium, 14.8% by weight cobalt and 10.2% by weight iron in pure form. After a complete dissolving of the alloy elements, the melt was poured into an iron mold having the dimensions 25×50×100 mm. The cast blocks were subsequently homogenized at 900° C./1 h. and then continuously cooled in the air. Cold rolling to an intermediate thickness of 0.75 mm. was followed by an annealing treatment at 500° C./1 h. and an etching in a dilute sulfuric acid for removing the scale layer. After a final rolling at 60% cold reduction, the tensile strength, semihardness temperature, Vickers hardness and the electrical conductivity were determined.

The mechanical and electrical characteristics of the samples are set forth in Table 2, together with the corresponding values for prior art alloys, which were taken from the literature (compare for example the paper entitled "Leadframe Materials from Tamagawa" (1983), in particular Pages 3, 4, 10, of the company Tamagawa Metal & Machinery Co., LTD. of Tokyo, Japan).

TABLE 2

Electrical and mechanical characteristics (condition hard, cold-rolled at 60% reduction, band thickness 0.3 mm.).

| Sample Identif. | Tensile Strength (N/mm$^2$) | Semihardness Temperature $T_H$ (°C.) | Vickers Hardness HV | Electrical Conductivity (% IACS) |
|---|---|---|---|---|
| 1 | 479 | 450 | 140 | 77 |
| 2 | 570 | 520 | 170 | 74 |
| CuFe2P (C 19400) | 480 | 400 | 145 | 65 |
| CuFeSnP (C 19520) | 540 | 450 | 165 | 48 |
| CuZn15 (C 23000) | 450 | 380 | 135 | 37 |

It is shown that the inventive alloys 1 and 2 have, in particular, a substantially higher conductivity than the prior art alloys. The inventive alloy 2, in which the ratio of titanium content to (cobalt+iron)−content Ti/(Co+Fe) is 1.0, is distinguished by a particularly high semihardness temperature.

The softening behavior of the inventive alloy 2 and the prior art alloys according to the state of the art, also including a consideration of an iron-nickel-alloy (Fe-Ni42), is illustrated in FIG. 1.

Figure 2:
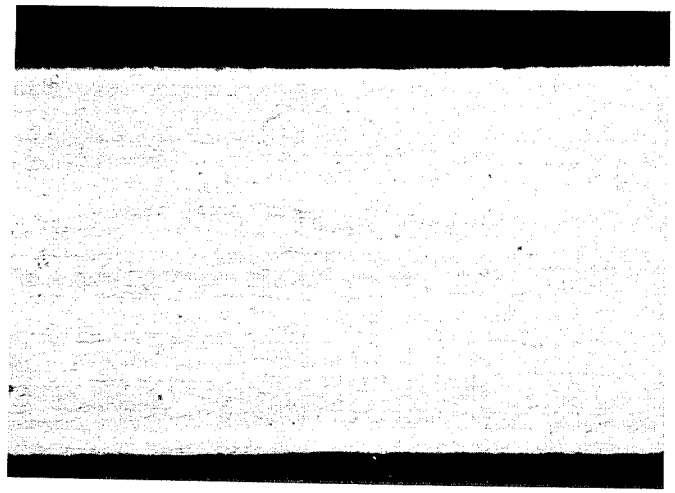
FIG. 2 is a photograph of a cold-rolled specimen of an alloy according to the present invention, 200X.
Figure 3:
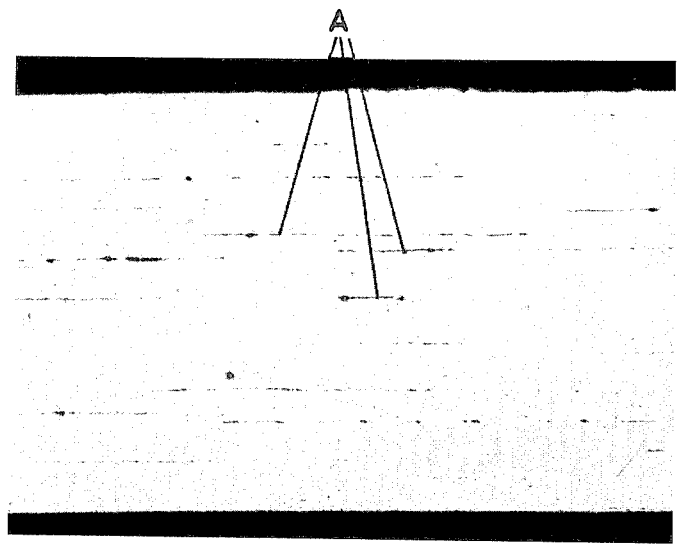
FIG. 3 is a photograph of a cold-rolled specimen of a prior art alloy, 100X.

The excellent mechanical and electrical characteristics of the inventive alloys result from separations (precipitation) of the participating alloy elements in a specific stoichiometric composition. The precipitated particles (nuclei) are extremely finely and homogeneously distributed in the copper matrix phase, so that an identification thereof under a light microscope is hardly possible, even when much enlarged. FIG. 2 shows, in an enlargement of 200:1, the etched structure of the inventive alloy 2 in a hard rolled condition. In comparison to this, FIG. 3 shows, in an enlargement of 100:1 the non-etched structure of a CuFe2P-sample (C 19400), wherein the coarse iron nuclei separations A, which are stretched in the rolling direction, can clearly be recognized.

Based on this favorable separation characteristic, the inventive alloys have, in addition to the already mentioned good values of conductivity and strength, also a good flexibility characteristic, which is achieved in materials having rougher separation particles, as for example CuFe2P (C 19400), only through a special annealing treatment. Moreover, a satisfactory connection between bond wires and lead frames is possible.

Although a particular preferred embodiment of the invention has been disclosed in detail for illustrative purposes, it will be recognized that variations or modifications of the disclosed apparatus, including the rearrangement of parts, lie within the scope of the present invention.

The embodiments of the invention in which an exclusive property or privilege is claimed are defined as follows:

1. A supporting or connecting element of an electronic device, said element being made of an alloy consisting of:

| | |
|---|---|
| Ti | 0.05–0.6 wt. % |
| Co | 0.05–0.6 wt. % |
| Cu and unavoidable impurities | balance | wherein the weight ratio of Ti/Co is from 1.0 to 1.5.

2. An element as claimed in claim 1, which is a lead frame.

3. An element as claimed in claim 1, in which said alloy is essentially free of zinc, tin, nickel, silicon, aluminum, cadmium, beryllium, lead, selenium and tellurium.

4. An alloy consisting of from 0.05 to 0.6 percent by weight of titanium, from 0.05 to 0.6 percent by weight of cobalt and the balance is copper and unavoidable impurities, the weight ratio of Ti/Co being from 1/1 to 1.5/1.

5. An electronic component made of an alloy as claimed in claim 4.

6. A lead frame for transistors and integrated circuits, said lead frame being made of an alloy as claimed in claim 4.

7. An alloy consisting of from 0.2 to 0.5 percent by weight of titanium, from 0.2 to 0.5 percent by weight of cobalt and the balance being copper and unavoidable impurities, the weight ratio of Ti/Co being from 1/1 to 1.5/1.

8. An electronic component made of an alloy as claimed in claim 7.

9. A lead frame for transistors and integrated circuits, said lead frame being made of an alloy as claimed in claim 7.

* * * * *